(12) United States Patent
Magoon

(10) Patent No.: US 6,744,795 B2
(45) Date of Patent: Jun. 1, 2004

(54) LASER DRIVER CIRCUIT AND SYSTEM

(75) Inventor: Vikram Magoon, Calabasas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/193,354

(22) Filed: Jul. 11, 2002

(65) Prior Publication Data

US 2004/0008745 A1 Jan. 15, 2004

(51) Int. Cl.[7] .............................. H01S 3/00
(52) U.S. Cl. ..................... 372/38.02; 372/38.07
(58) Field of Search ................ 372/38.02, 38.07

(56) References Cited

U.S. PATENT DOCUMENTS 6,389,050 B2 * 5/2002 Stronczer ............ 372/38.02
6,392,215 B1 * 5/2002 Baumgartner et al. ...... 250/205
6,532,245 B1 * 3/2003 Paschal et al. ........... 372/38.02
6,587,489 B2 * 7/2003 Schrodinger ............ 372/29.01

OTHER PUBLICATIONS

Design of Analog CMOS Integrated Circuits, Behzad Razavi, 2001, pp. 393 and 394.
IEEE P802.3ae, Apr. 15, 2002, clauses 46–48.

* cited by examiner

*Primary Examiner*—David Porta
*Assistant Examiner*—Davienne Monbleau
(74) *Attorney, Agent, or Firm*—Paul G. Nagy

(57) ABSTRACT

A laser driver circuit to provide a modulation current is disclosed. A current mirror circuit generates the modulation current in response to a reference current. The current mirror circuit comprises an operational amplifier providing an output signal to gates of transistors forming the current mirror circuit.

21 Claims, 4 Drawing Sheets

LASER DRIVER CIRCUIT AND SYSTEM

BACKGROUND

1. Field

The subject matter disclosed herein relates to data communication systems. In particular, the subject matter disclosed herein relates to transmitting data in an optical transmission medium.

2. Information

Data transmission in an optical transmission medium such as fiber optic cabling has enabled communication at data rates of 10 gigabits per second and beyond according to data transmission standards set forth in IEEE P802.3ae and Synchronous Optical Network/Synchronous Digital Hierarchy (SONET/SDH) published by the International Telecommunications Union (ITU). To transmit data in the optical transmission medium, a laser device typically modulates an optical signal using wave division multiplexing (WDM) in response to a data signal.

FIG. 1 shows a schematic diagram of a prior art laser driver circuit 50 to provide a modulation current 60 to a laser device 58. The laser device circuit may be formed in a single complementary metal oxide semiconductor (CMOS) device. The laser device 58 receives a modulation current 60 to power the transmission of an optical signal 62 in an optical transmission medium. The laser device 58 typically also modulates the optical signal in response to a data signal. The laser driver circuit receives a reference current 52 generated by, for example, a controlled voltage source applied across an off-chip resistor. A diode coupled field effect transistor (FET) 54 and FET 56 form a current mirror to generate the modulation current 60 at a magnitude that is substantially proportional to the magnitude of the input reference current 52. Short channel lengths in such a CMOS device may introduce channel length modulation effects, causing non-linearities in the output modulation current 60 (e.g., affecting the ratio of the reference current 52 to the modulation current 60). The resulting magnitude of the modulation current 60, therefore, may not be sufficiently accurately generated for high data rate communication in an optical transmission medium.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
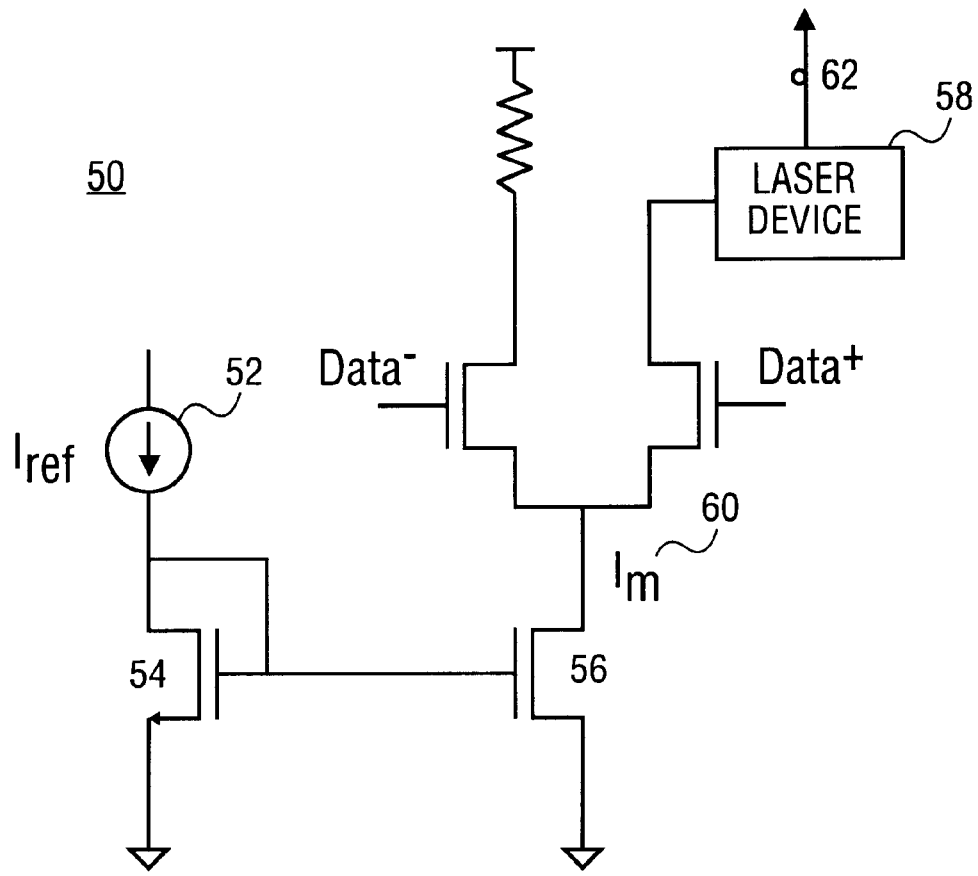
FIG. 1 shows a schematic diagram of a prior art laser driver circuit to provide a modulation current to a laser device.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

A "data bus" as referred to herein relates to circuitry for transmitting data between devices. A "multiplexed data bus" as referred to herein relates to a data bus that is capable of transmitting data among two or more devices coupled to the multiplexed data bus. A multiplexed data bus may transmit data messages to a device coupled to the multiplexed data bus according to an address associated with the device or a position on the multiplexed data bus where the device is coupled. However, this is merely an example of a multiplexed data bus and embodiments of the present invention are not limited in this respect.

An "optical transmission medium" as referred to herein relates to a transmission medium capable of transmitting light energy in an optical signal which is modulated by a data signal and which is recoverable by demodulating the optical signal. For example, an optical transmission medium may comprise fiber optic cabling coupled between a transmitting point and a receiving point. However, this is merely an example of an optical transmission medium and embodiments of the present invention are not limited in this respect.

A "laser driver circuit" as referred to herein relates to a circuit to provide power to a laser device to be used for transmitting a signal in an optical transmission medium. For example, a laser driver circuit may provide a "modulation current" to a laser device to be used in modulating an optical signal. However, this is merely an example of a laser driver circuit and embodiments of the present invention are not limited in these respects.

An "operational amplifier" as referred to herein relates to a circuit or device to provide an output signal at an output terminal in response to a differential signal provided to input terminals. For example, an operational amplifier may provide an output voltage at the output terminal as a gain of a differential voltage applied to inverting and non-inverting input terminals. However, this is merely an example of an operational amplifier and embodiments of the present invention are not limited in this respect.

A "current mirror circuit" as referred to herein relates to a circuit to provide an output current in response to an input current. For example, a current mirror circuit may provide an output current having a magnitude that is substantially proportional to the magnitude of an input current. However, this is merely an example of a current mirror circuit and embodiments of the present invention are not limited in these respects.

Briefly, an embodiment of the present invention relates to a laser driver circuit to provide a modulation current. A current mirror circuit may generate the modulation current in response to a reference current. The current mirror circuit may comprise an operational amplifier providing an output signal to gates of transistors forming the current mirror circuit. However, this is merely an example embodiment and other embodiments of the present invention are not limited in these respects.

Figure 2:
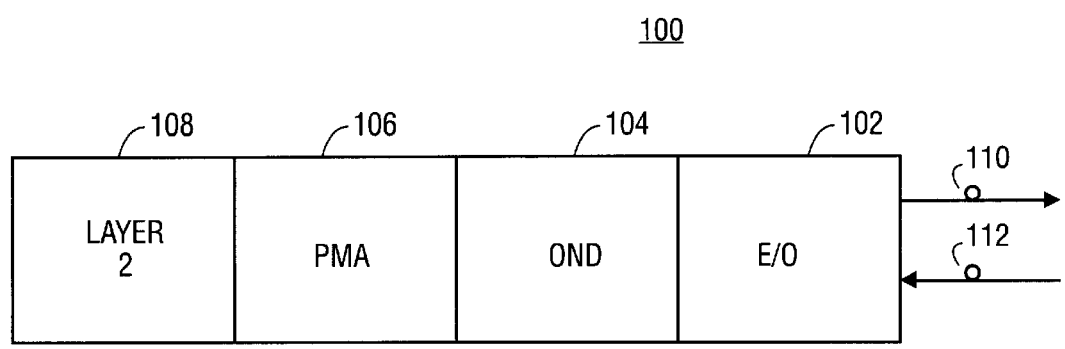
FIG. 2 shows schematic diagram of a system to transmit in and receive data from an optical transmission medium according to an embodiment of the present invention.

FIG. 2 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple "lanes" of data in the optical transmission medium.

A physical medium dependent (PMD) section 104 may provide circuitry, such as a transimpedance amplifier (TIA) (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 in based upon a serial data signal provided by the clock and data recovery circuitry.

According to an embodiment, the layer 2 section 108 may comprise a media access control (MAC) device coupled to the PMA section 106 at a media independent interface (MII) as defined IEEE P.802.3ae, clause 46. In other embodiments, the layer 2 section 108 may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices on a processing platform. Such an I/O system may include, for example, a multiplexed data bus coupled to a processing system or a multi-port switch fabric. The layer 2 section 108 may also be coupled to a multi-port switch fabric through a packet classifier device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE P.802.3ae, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 3:
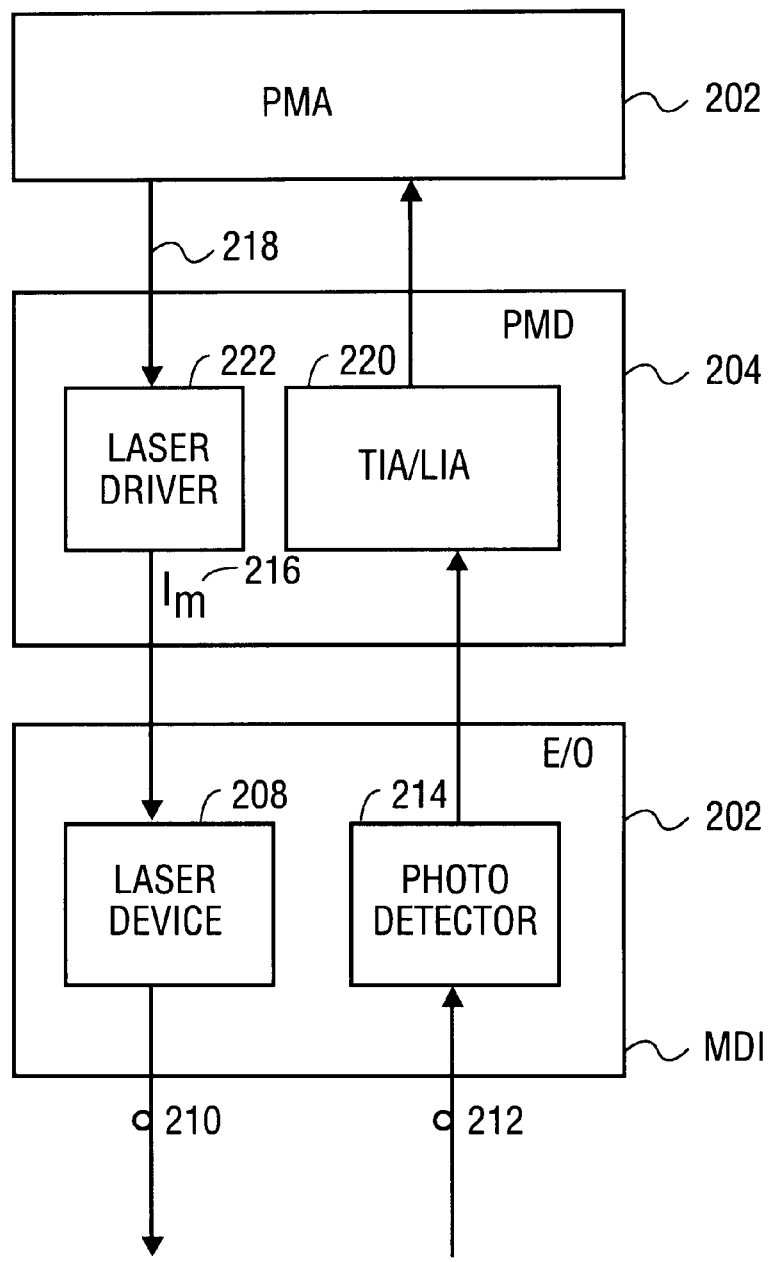
FIG. 3 shows a schematic diagram of physical medium attachment and physical medium dependent sections of a data transmission system according to an embodiment of the system shown in FIG. 2.

FIG. 3 shows a schematic diagram of a system 200 to transmit data in and receive data from an optical transmission medium according to an embodiment of the system shown in FIG. 2. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may modulate a modulation current 216 in response to a data signal from a PMA section. A laser device 208 may then modulate and power the transmitted optical signal 210 in response to the modulation current 216.

Figure 4:
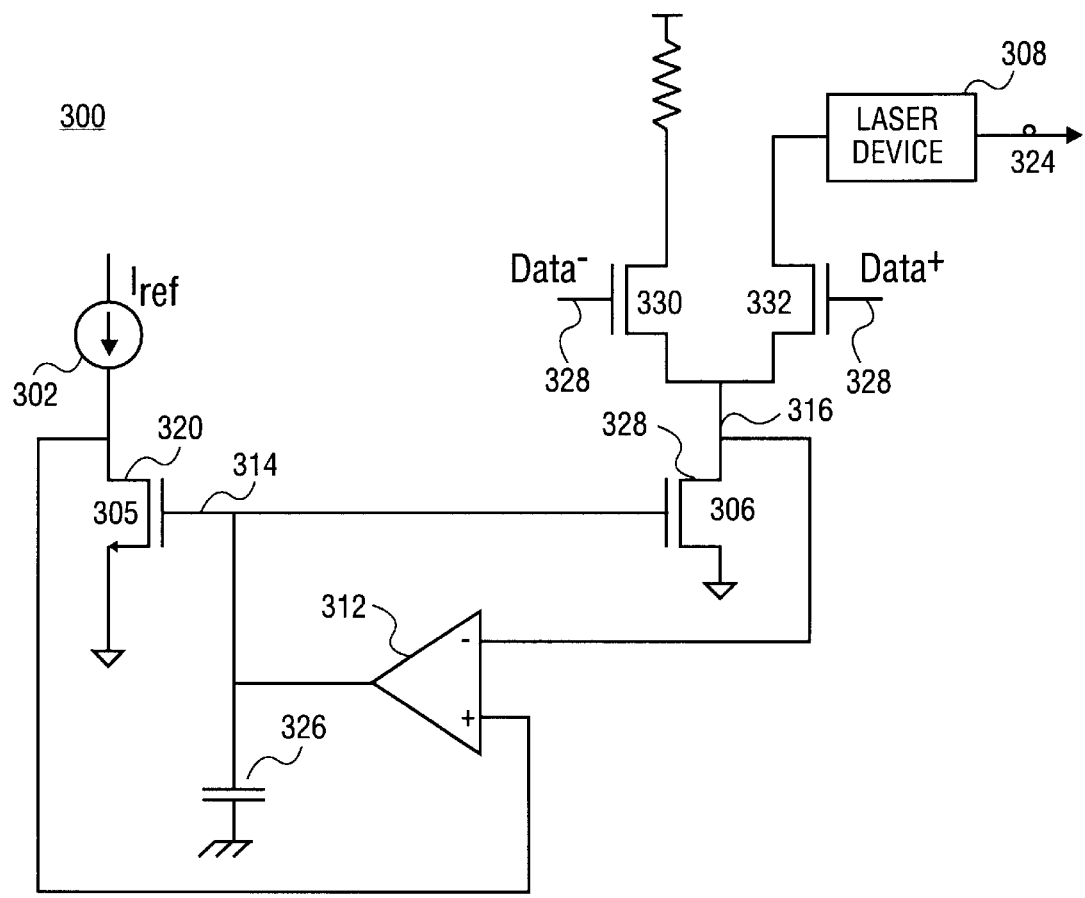
FIG. 4 shows a schematic diagram of a laser driver circuit according to an embodiment of the physical medium dependent section shown in FIG. 3.

FIG. 4 shows a schematic diagram of a laser driver circuit 300 according to an embodiment of the laser driver circuit 222 shown in FIG. 3. The laser driver circuit 300 may be formed in a single complementary metal oxide semiconductor (CMOS) device. The laser device 308 may modulate an optical signal 324 an optical transmission medium in response to a modulation current 316. The modulation current 316 may be switched by FETs 330 and 332 in response to a data signal 328. The laser driver circuit 300 comprises an output stage including a field effect transistor (FET) 306 providing the modulation current 316 to the laser device at a desired current magnitude. However, this is merely an example of how a laser device may receive a modulation current and a data signal to modulate an optical signal, and embodiments of the present invention are not limited in these respects.

The FET 306 and an FET 304 provide a current mirror circuit to generate the modulation current 316 having a magnitude that is substantially proportional to the magnitude of a reference current 302. Accordingly, the magnitude of the modulation current 316 is substantially a scalar multiple of the reference current 302 where the scalar multiple is based, at least in part, on the physical characteristics and behavior of the FETs 304 and 306 (e.g., as formed in a CMOS implementation). The reference current 302 may be generated by, for example, a controlled voltage source (not shown) applied across an off-chip resistor (not shown). Given the scalar multiple of the current mirror (to generate the modulation current 316 in response to the reference current 302), the modulation current 316 may be set by selecting a particular resistance for the off-chip resistor. However, this is merely an example of determining a reference current input to a laser driver circuit, and embodiments of the present invention are not limited in this respect.

According to an embodiment, an operational amplifier 312 comprises an output terminal coupled to gates 314 of the FETs 304 to provide negative feedback from the drain terminals 320 and 316. The output signal of the operational amplifier 312 may cause the drain to source voltages for the respective FETs 304 and 306 (i.e., voltage between terminals 320 and 322 of FET 304, and voltage between terminals 316 and 318 of FET 306) to be maintained substantially the same. Accordingly, the resulting current mirror circuit may provide a substantially linear and predictable response to the reference current 302 in generating the modulation current 316, notwithstanding short channel lengths in a CMOS implementation of the current mirror.

The current mirror of driver circuit 300 comprises n-channel FETs 304 and 306. However, it should be understood that laser driver circuits according to other embodiments may comprise a current mirror comprising p-channel FETs without departing from the invention.

In the illustrated embodiment, the operational amplifier 312 receives inputs from the drain terminals 320 and 328 at non-inverting and inverting input terminals, respectively. A capacitor 326 may be coupled to the output of the operational amplifier 312, and the gates 314 of the FETs 304 and 306 to stabilize the negative feedback loop. The capacitance of the capacitor 326 may be selected to maintain any phase shift of the feedback loop to within a phase margin (e.g., 60 degrees or more) based upon the gain associated with the operational amplifier 312 and size of the FETs 304 and 306. However, this is merely an example of sizing a capacitor to stabilize a negative feedback loop and embodiments of the present invention are not limited in these respects.

At an initial condition, neither the FET 304 nor 306 may carry sufficient current to prevent a "lock-up" condition. According to an embodiment, a startup circuit (not shown) may be used to initialize the negative feedback loop until reaching steady state stability by applying a set minimum voltage to the gate terminals 314 of the FETs 304 and 306. Upon reaching steady state (e.g., at the gate voltage at gate terminals 314), the startup circuit may be disabled.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A laser driver circuit comprising:
   an output stage to provide a modulation current to a laser device; and
   a current mirror circuit to generate the modulation current in response to a reference current, the current mirror circuit comprising:
      a first transistor to receive the reference current;
      a second transistor coupled to the first transistor to generate the modulation current; and
      an operational amplifier comprising an output terminal coupled to a gate terminal of one of the first and second transistors.

2. The laser driver circuit of claim 1, wherein gate terminals of the first and second transistors are coupled to a capacitor.

3. The laser driver circuit of claim 1, wherein the operational amplifier further comprises:
   a first input terminal coupled to one of a source terminal and a drain terminal of the first transistor; and
   a second input terminal coupled to one of a source terminal and a drain terminal of the second transistor.

4. The laser driver circuit of claim 1, wherein the first and second transistors comprise source to drain voltages that are substantially matched in response to an output of the operational amplifier.

5. A system comprising:
   a serializer to provide a serial data signal in response to a parallel data signal;
   a laser device capable of being coupled to an optical transmission medium to transmit an optical signal in the optical transmission medium in response to the serial data signal and a modulation current; and
   a laser driver circuit to generate the modulation current in response to a reference current, the laser driver circuit comprising
      a first transistor to receive the reference current;
      a second transistor coupled to the first transistor to generate the modulation current; and
      an operational amplifier comprising an output terminal coupled to a gate terminal of one of the first and second transistors.

6. The system of claim 5, the system further comprising a SONET framer to provide the parallel data signal.

7. The system of claim 6, wherein the system further comprises a switch fabric coupled to the SONET framer.

8. The system of claim 5, the system further comprising an Ethernet MAC to provide the parallel data signal at a media independent interface.

9. The system of claim 8, wherein the system further comprises a multiplexed data bus coupled to the Ethernet MAC.

10. The system of claim 8, wherein the system further comprises a switch fabric coupled to the Ethernet MAC.

11. The system of claim 5, wherein gate terminals of the first and second transistors are coupled to a capacitor.

12. The system of claim 5, wherein the operational amplifier further comprises:
    a first input terminal coupled to one of a source terminal and a drain terminal of the first transistor; and
    a second input terminal coupled to one of a source terminal and a drain terminal of the second transistor.

13. The system of claim 5, wherein the source to drain voltages of the first and second transistors is substantially matched in response to an output of the operational amplifier.

14. A method comprising:
    receiving a reference current at a first transistor of a current mirror circuit;
    generating a modulation current from a second transistor of the current mirror circuit in response to the reference current;
    providing an output signal of an operational amplifier to a gate terminal of one of the first and second transistors; and
    modulating an optical signal in an optical transmission medium in response to a data signal and the modulation current.

15. The method of claim 14, the method further comprising coupling a capacitor to gate terminals of the first and second transistors.

16. The method of claim 14, the method further comprising:
    providing a first input to the operational amplifier from one of a source terminal and a drain terminal of the first transistor; and
    providing a second input to the operational amplifier from one of a source terminal and a drain terminal of the second transistor.

17. The method of claim 14, the method further comprising substantially matching source to drain voltages of the first and second transistors in response to the output signal of the operational amplifier.

18. An apparatus comprising:
    means for receiving a reference current at a first transistor of a current mirror circuit;
    means for generating a modulation current from a second transistor of the current mirror circuit in response to the reference current;

means for providing an output signal of an operational amplifier to a gate terminal of one of the first and second transistors; and means for modulating an optical signal in an optical transmission medium in response to a data signal and the modulation current.

19. The apparatus of claim 18, the apparatus further comprising means for coupling a capacitor to gate terminals of the first and second transistors.

20. The apparatus of claim 18, the apparatus further comprising:

means for providing a first input to the operational amplifier from one of a source terminal and a drain terminal of the first transistor; and means for providing a second input to the operational amplifier from one of a source terminal and a drain terminal of the second transistor.

21. The apparatus of claim 18, the apparatus further comprising means for substantially matching source to drain voltages of the first and second transistors in response to the output signal of the operational amplifier.

* * * * *